United States Patent
Li

(10) Patent No.: US 10,037,924 B2
(45) Date of Patent: Jul. 31, 2018

(54) FIN-FET DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/287,302

(22) Filed: Oct. 6, 2016

(65) Prior Publication Data

US 2017/0186654 A1 Jun. 29, 2017

(30) Foreign Application Priority Data

Dec. 25, 2015 (CN) .......................... 2015 1 0993741

(51) Int. Cl.
*H01L 21/8238* (2006.01)
*H01L 21/265* (2006.01)
(Continued)

(52) U.S. Cl.
CPC ............... *H01L 21/823871* (2013.01); *H01L 21/26506* (2013.01); *H01L 21/28518* (2013.01);
(Continued)

(58) Field of Classification Search
CPC ....... H01L 21/823814; H01L 21/28518; H01L 21/823821; H01L 27/0924
See application file for complete search history.

(56) References Cited

U.S. PATENT DOCUMENTS

2010/0276761 A1 11/2010 Tung et al.
2013/0249006 A1 9/2013 Khakifirooz et al.
(Continued)

OTHER PUBLICATIONS

The European Patent Office (EPO) The Extended European Search Report for 16204646.0 dated Jun. 2, 2017 11 Pages.

*Primary Examiner* — Amar Movva
(74) *Attorney, Agent, or Firm* — Anova Law Group, PLLC

(57) ABSTRACT

A method for fabricating a Fin-FET device includes forming fin structures with each having a gate structure on the top in both P-type regions and N-type regions, forming a first epitaxial layer on each fin structure on both sides of the gate structure in the P-type regions, forming a P-type doped first covering layer on each first epitaxial layer, forming a second epitaxial layer on each fin structure on both sides of the gate structure in the N-type regions, forming an N-type doped second covering layer on each second epitaxial layer, and forming a titanium-containing silicification layer on the first covering layer and the second covering layer. The method further includes performing a first annealing process to let titanium ions in the silicification layer diffuse into the first covering layer to form a first metal silicide layer and into the second covering layer to form a second metal silicide layer.

14 Claims, 10 Drawing Sheets

(51) Int. Cl.
*H01L 21/285* (2006.01)
*H01L 21/306* (2006.01)
*H01L 21/324* (2006.01)
*H01L 21/768* (2006.01)
*H01L 23/535* (2006.01)
*H01L 27/092* (2006.01)
*H01L 29/06* (2006.01)
*H01L 29/36* (2006.01)
*H01L 29/45* (2006.01)
*H01L 29/66* (2006.01)
*H01L 29/78* (2006.01)
*H01L 29/417* (2006.01)

(52) U.S. Cl.
CPC ...... *H01L 21/30604* (2013.01); *H01L 21/324* (2013.01); *H01L 21/76895* (2013.01); *H01L 21/823814* (2013.01); *H01L 21/823821* (2013.01); *H01L 23/535* (2013.01); *H01L 27/0924* (2013.01); *H01L 29/0649* (2013.01); *H01L 29/36* (2013.01); *H01L 29/45* (2013.01); *H01L 29/66795* (2013.01); *H01L 29/785* (2013.01); *H01L 29/41791* (2013.01)

(56) References Cited

U.S. PATENT DOCUMENTS

| | | |
|---|---|---|
| 2015/0041852 A1 | 2/2015 | Kwok et al. |
| 2015/0041855 A1 | 2/2015 | Liao et al. |
| 2015/0041918 A1 | 2/2015 | Wann et al. |
| 2015/0206942 A1 | 7/2015 | Glass et al. |
| 2015/0303118 A1 | 10/2015 | Wang et al. |
| 2015/0364579 A1 | 12/2015 | Jangjian et al. | ns # FIN-FET DEVICE AND FABRICATION METHOD THEREOF

CROSS-REFERENCES TO RELATED APPLICATIONS

This application claims the priority of Chinese Patent Application No. CN201510993741.9, filed on Dec. 25, 2015, the entire content of which is incorporated herein by reference.

FIELD OF THE DISCLOSURE

The present disclosure generally relates to the field of semiconductor fabrication technology and, more particularly, relates to a Fin-FET device and fabrication methods thereof.

BACKGROUND

With rapid development of semiconductor fabrication technology, semiconductor devices are developed towards a direction of having a higher component density and a higher integration degree. As one of the most fundamental semiconductor devices, transistors have been widely used. With the improvement of the component density and the integration degree, the size of the gate electrode in planar transistors becomes smaller and smaller. However, as the feature size decreases, the ability of traditional planar transistors in controlling the channel current becomes less sufficient, which may cause short channel effect and leakage current, and thus may ultimately affect the electrical performance of the semiconductor devices.

According to existing methods, fin-field effect transistor (Fin-FET) has been proposed in order to overcome the short channel effect and suppress the leakage current. A Fin-FET may be a multi-gate device.

As an example, a Fin-FET may include a substrate, a fin structure formed on the surface of the substrate, and an isolation layer formed on the surface of the substrate. The isolation layer covers a portion of the sidewall of the fin structure and the top surface of the isolation layer is lower than the top surface of the fin structure. The Fin-FET also includes a gate structure formed across the fin structure. Specifically, the gate structure is formed on the surface of the isolation layer and the top and the side surfaces of the fin structure. The Fin-FET further includes a source region and a drain region formed in the fin structure on the two sides of the gate structure.

Moreover, the Fin-FET also includes an epitaxial layer formed in the fin structure on the two sides of the gate structure in order to improve the performance of the Fin-FET. The source region and the drain region are formed in the epitaxial layer by inducing P-type or N-type ions into the epitaxial layer. Forming the epitaxial layer may raise the surface height for the source region and the drain region so that the stress in the source region and the drain region may be released. In addition, due to the formation of the epitaxial layer, a stress may be induced to the fin structure situated under the gate structure. Therefore, the carrier mobility in the channel region may be improved.

However, with decrease in the feature size of semiconductor devices, the product yield and the reliability of existing Fin-FETs may also decrease. The disclosed fabrication method and transistor device are directed to solve one or more problems set forth above and other problems in the art.

BRIEF SUMMARY OF THE DISCLOSURE

One aspect of the present disclosure includes a method for fabricating a Fin-FET device. The method includes providing a substrate including a plurality of P-type regions and a plurality of N-type regions, and forming a plurality of fin structures on each of the P-type regions and the N-type regions with one gate structure formed on the top surface of each fin structure. The method further includes forming a first epitaxial layer on the top surface of each fin structure on both sides of the corresponding gate structure in the P-type regions, and forming a first covering layer covering each first epitaxial layer. The first epitaxial layer is doped with P-type ions, while the first covering layer is also doped with P-type ions and contains germanium ions. The method also includes forming a second epitaxial layer on the top surface of each fin structure on both sides of the corresponding gate structure in the N-type regions, and forming a second covering layer covering each second epitaxial layer. The second covering layer is doped with N-type ions and contains germanium ions. The method further includes forming a silicification layer containing titanium ions on at least a portion of the first covering layer and on at least a portion of the second covering layer, and then performing a first annealing process to let the titanium ions in the silicification layer diffuse into the first covering layer to form a first metal silicide layer and also diffuse into the second covering layer to form a second metal silicide layer.

Another aspect of the present disclosure provides a Fin-FET device. The Fin-FET device includes a plurality of P-type regions and a plurality of N-type regions formed on a substrate with each of the P-type regions and the N-type regions including a plurality of fin structures. For each fin structure, one gate structure is formed on the top. The Fin-FET further includes a first epitaxial layer formed on the top surface of each fin structure on both sides of the corresponding gate structure in the P-type regions, and a first covering layer formed on the top surface of each first epitaxial layer. The first epitaxial layer is doped with P-type ions, while the first covering layer is also doped with P-type ions and contains germanium ions. The Fin-FET device also includes a second epitaxial layer formed on the top surface of each fin structure on both sides of the corresponding gate structure in the N-type regions, and a second covering layer formed on a top surface of each second epitaxial layer. The second covering layer contains germanium ions and is doped with N-type ions. The Fin-FET device further includes a titanium-containing silicification layer formed on at least a portion of the first covering layer and on at least a portion of the second covering layer. Finally, the Fin-FET includes a first metal silicide layer formed from a top portion of the first covering layer and a second metal silicide layer formed from a top portion of the second covering layer by performing a first annealing process to let titanium ions in the silicification layer diffuse into the top portion of the first covering layer and the top portion of the second covering layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In an existing Fin-FET, the epitaxial layer is often made of a semiconductor material and the conductive structure formed on the epitaxial layer is usually made of a metal. Therefore, the interface between the epitaxial layer and the conductive structure is a semiconductor/metal interface and, thus, a Schottky barrier may be formed at the interface between the epitaxial layer and the conductive structure. As a result, charge carriers may not be able to easily pass through the interface between the epitaxial layer and the conductive structure and, thus, the contact resistance between the epitaxial layer and the conductive structure may be large. Moreover, such a large contact resistance between the epitaxial layer and the conductive structure may affect the performance of the ultimately-formed semiconductor device.

An existing method to reduce the contact resistance between the epitaxial layer and the conductive structure is to use a metal silicide to form an electric contact layer on the surface of a stress layer. The use of the metal silicide may reduce the contact resistance between the conductive structure and the stress layer.

Figure 1:
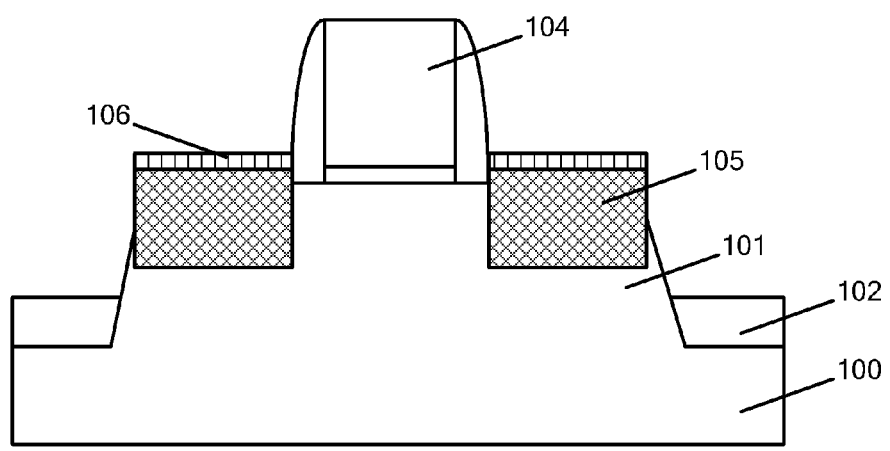
FIG. 1 illustrates a schematic cross-section view of a Fin-FET fabricated by an existing method.

FIG. 1 shows a schematic cross-section view of a Fin-FET fabricated by an existing method. Referring to FIG. 1, the Fin-FET includes a substrate 100, a fin structure 101 formed on the surface of the substrate 100, and an isolation layer 102. The isolation layer 102 is formed to cover a portion of each side surface of the fin structure 101. The top surface of the isolation layer 102 is lower than the top surface of the fin structure 101. The Fin-FET further includes a gate structure 104 formed across the fin structure 101. The gate structure 104 covers a portion of the side surface and the top surface of the fin structure 101. The Fin-FET also includes an epitaxial layer 105 formed in the fin structure 101 on the two sides of the gate structure 104 and a covering layer 106 formed on the surface of the epitaxial layer 105. Moreover, the epitaxial layer 105 contains P-type ions or N-type ions.

The covering layer 106 is then converted into an electric contact layer through a metal silicide process performed subsequently. The electric contact layer is made of a metal silicide material. Specifically, the metal silicide process includes forming a metal layer on the surface of the covering layer 106, and then performing an annealing process to allow the metal ions in the metal layer to diffuse into the covering layer 106. After annealing, an electric contact layer is formed from the covering layer 106. Finally, the metal silicide process further includes removing the remaining portion of the metal layer after the annealing process.

Usually, the covering layer 106 is made of single crystalline silicon while the metal layer is made of Ni or Co. The electric contact layer is used to connect to a subsequently-formed conductive structure, such as a conductive plug, etc. By introducing the electric contact layer, the contact resistance between the conductive structure and the epitaxial layer 105 may be reduced and, thus, the performance of the Fin-FET is improved.

However, with continuously reduced feature size of semiconductor devices, the feature size of Fin-FETs also becomes smaller. Therefore, the contact area between the electric contact layer and the conductive structure may also be reduced, leading to an increase in the contact resistance between the conductive structure and the epitaxial layer 105. As a result, the performance of Fin-FET may be degraded.

In order to reduce the contact resistance between the electric contact layer and the conductive structure, two methods have been used. Specifically, one method is to reduce the height of the Schottky barrier between the electric contact layer and the epitaxial layer 105, while the other method is to increase the doping concentration of P-type ions or N-type ions at the interface between the electric contact layer and the epitaxial layer. However, in most cases, introducing metal ions may cause Fermi level pinning in the semiconductor material. Therefore, after forming the electric contact layer using Ni or Co, further doping the semiconductor with P-type or N-type ions may not be able to effectively reduce the contact resistance between the electric contact layer and the epitaxial layer.

Figure 19:
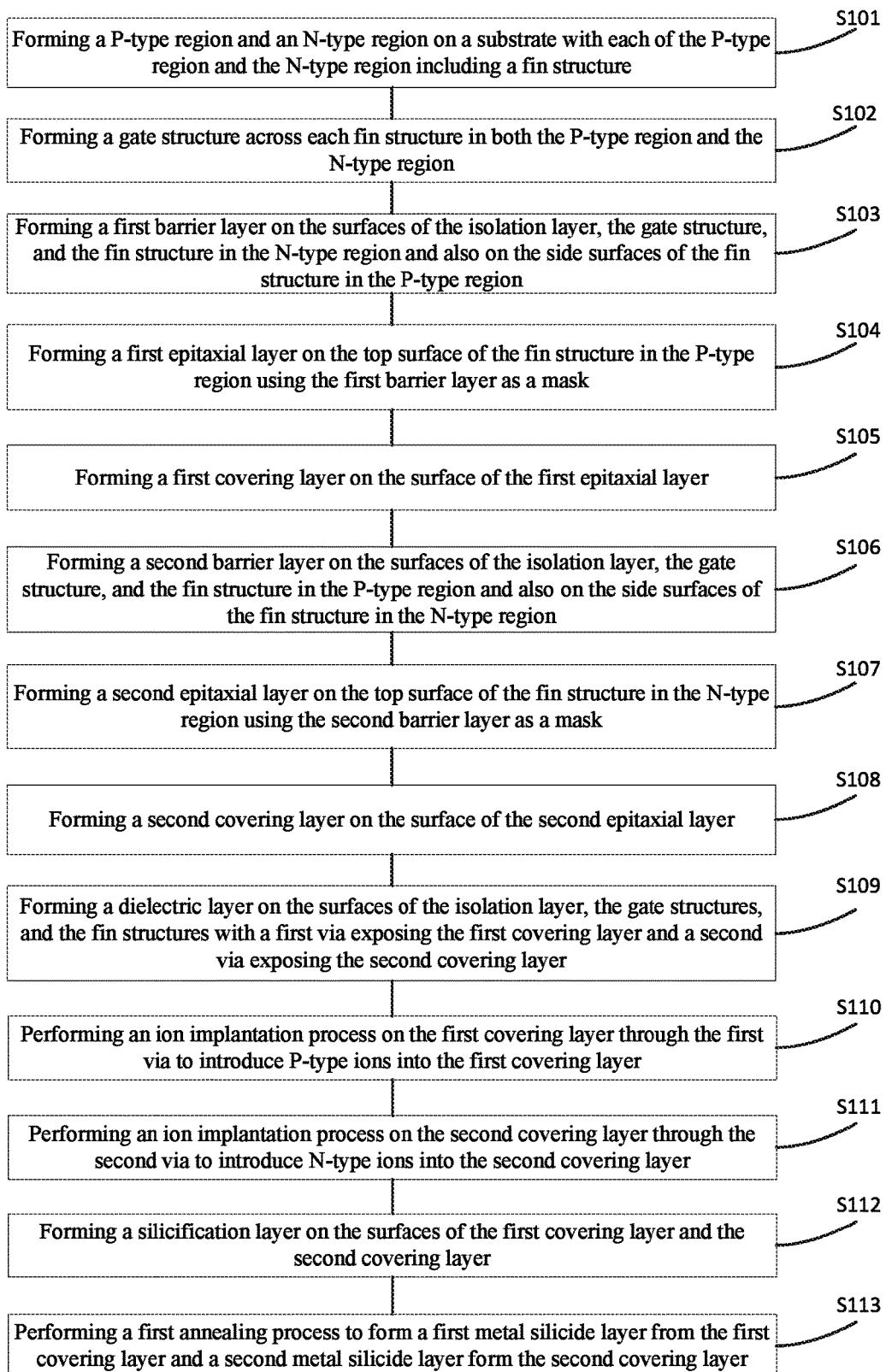
FIG. 19 illustrates a flowchart of the exemplary fabrication process consistent with disclosed embodiments.

The present disclosure provides a method to fabricate a Fin-FET device. FIG. 19 shows a flowchart of an exemplary process for fabricating a Fin-FET device consistent with disclosed embodiments. FIGS. 2-16 show schematic views of semiconductor structures corresponding to certain stages of the exemplary fabrication method.

Figure 2:
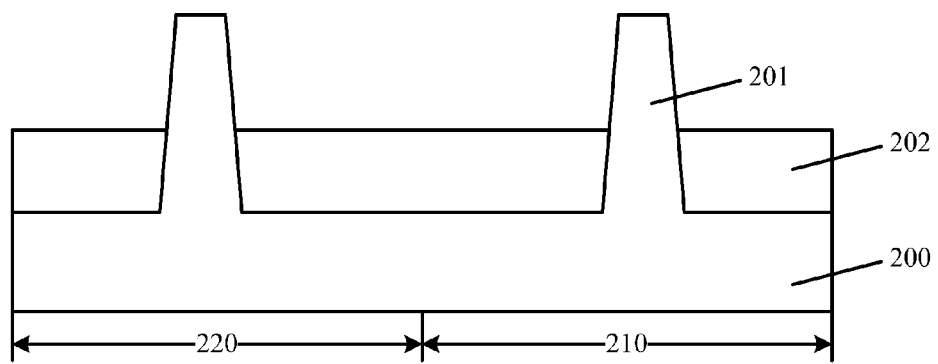
FIGS. 2-16 illustrate schematic views of semiconductor structures corresponding to certain stages of an exemplary fabrication method consistent with disclosed embodiments.

Referring to FIG. 19, at the beginning of the fabrication process, a substrate including a plurality of P-type regions and a plurality of N-type regions may be provided and a plurality of fin structures may be formed in each of the P-type regions and the N-type regions (S101). FIG. 2 shows a schematic cross-section view of the semiconductor structure.

Referring to FIG. 2, a substrate 200 may be provided. A plurality of P-type regions 210 and a plurality of N-type regions 220 may be formed in the substrate 200. Further, a plurality of fin structures 201 may be formed on the surface of each of the P-type regions 210 and the N-type regions 220. Moreover, an isolation layer 202 may also be formed on the surface of the substrate 200. The isolation layer 202 may cover a portion of the side surfaces of each fin structure 201 and the top surface of the isolation layer 202 may be lower than the top surfaces of the fin structures 201.

For illustration purposes, the structure shown in FIG. 2 includes only one P-type region 210 and one N-type region 220. In other embodiments, the number of the P-type regions 210 may be greater than one, while the number of the N-type regions 220 may also be greater than one. In addition, as shown in FIG. 2, in one embodiment, each of the P-type region and the N-type region only includes one fin structure 201. In other embodiments, the number of the fin structures 201 formed in each of the P-type regions 210 may be more than one and the number of the fin structures 201 formed in each of the N-type regions 220 may also be more than one.

In one embodiment, the P-type region 210 may be used to form a PMOS transistor while the N-type region 220 may be used to form an NMOS transistor. Further, the width of the fin structures 201 in the P-type region 210 and the N-type region 220 may be smaller than or equal to 20 nm.

The substrate 200 and the fin structures 201 may be formed by a method including the following steps. First, a semiconductor base is provided. A mask layer may then be formed on the surface of the semiconductor base. The mask layer may cover the regions on the semiconductor base corresponding to the fin structures 201 to be formed. A plurality of trenches may be formed in the semiconductor base by etching the semiconductor base using the mask layer as an etch mask. Simultaneously with the formation of the plurality of trenches, a plurality of fin structures 201 may also be formed in the semiconductor base between neighboring trenches. The portion of the semiconductor base below the plurality of fin structures 201 and the plurality of the trenches may form the substrate 200.

The semiconductor base may be made of single crystal silicon, single crystal germanium, silicon germanium, and/or silicon carbide. In one embodiment, the substrate 200 and the fin structures 201 are formed from single crystal silicon.

In another embodiment, the fin structures 201 may be formed by a method including the following steps. First, a substrate 200 is provided. A fin structure layer may then be formed on the surface of the substrate 200 by an epitaxial process. A mask layer may be formed on the surface of the fin structure layer with the mask layer covering the regions corresponding to the plurality of fin structures 201 to be formed. A plurality of trenches may be formed in the fin structure layer by etching the fin structure layer using the mask layer as an etch mask. Simultaneously with the formation of the plurality of trenches, a plurality of fin structures 201 may also be formed in the fin structure layer between neighboring trenches.

The substrate 200 may be made of silicon, silicon germanium, silicon carbide, silicon on insulator (SOI), germanium on insulator (GOI), glass, or a Group III-V semiconductor material such as gallium nitride, gallium arsenide, etc. The fin structures 201 may be made of silicon, germanium, silicon carbide, and/or silicon germanium.

The isolation layer 202 may be used to separate neighboring fin structures 201. The isolation layer 202 may be made of one or more of $SiO_x$, $SiN_x$, SiON, a low-k dielectric material (e.g., a material with a dielectric constant greater than or equal to 2.5 but less than 3.9), and an ultra-low-k dielectric material (e.g., a material with a dielectric constant less than 2.5). In one embodiment, the isolation layer 202 is made of $SiO_x$. The thickness of the isolation layer 202 may be in a range of 50 nm to 80 nm. For example, the thickness of the isolation layer 202 may be 60 nm.

The isolation layer 202 may be formed by a method including the following steps. First, an isolation film may be formed on the surfaces of the substrate 200 and the plurality of fin structures 201. A planarization process may then be performed on the isolation film until the top surface of the fin structures 201 is exposed. After the planarization process, the isolation film may then be etched back to expose a portion of the side surfaces of each fin structure 201. As such, the isolation layer 202 may be formed. In one embodiment, a mask layer may be used for forming the plurality of fin structures 201 in a previous process. Accordingly, after forming the isolation layer 202, the mask layer situated on the top surfaces of the fin structures 201 may be removed. The mask layer may serve as a stop layer during the planarization process performed on the isolation film. Therefore, the mask layer may be used to protect the top surface of the plurality of fin structures 201.

In one embodiment, the fabrication method may further include forming a first well region in the substrate 200 and the fin structures 201 of the P-type region while a second well region in the substrate 200 and the fin structures 201 of the N-type region. The first well region and the second well region may be formed by an ion implantation process performed before or after the formation of the fin structures 201.

Figure 3:
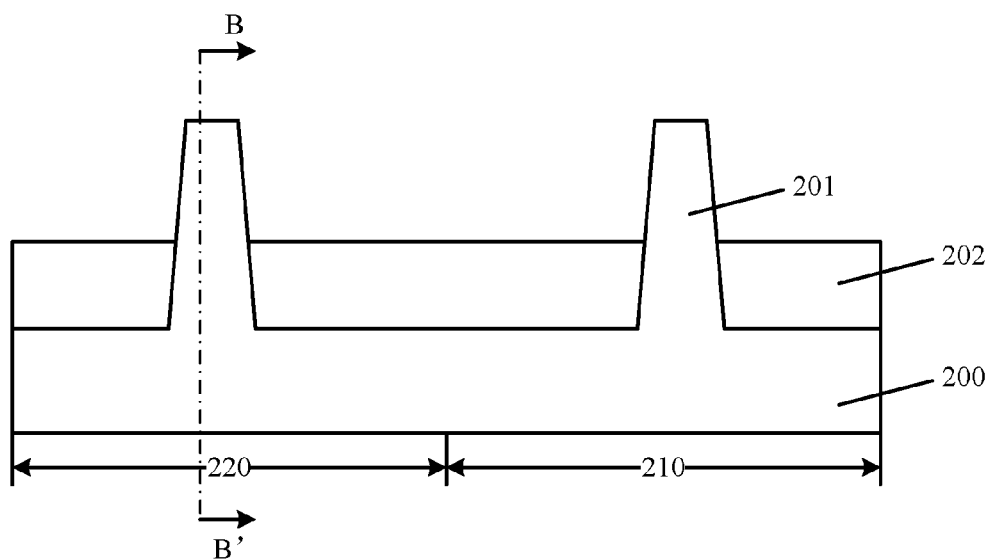
Figure 4:
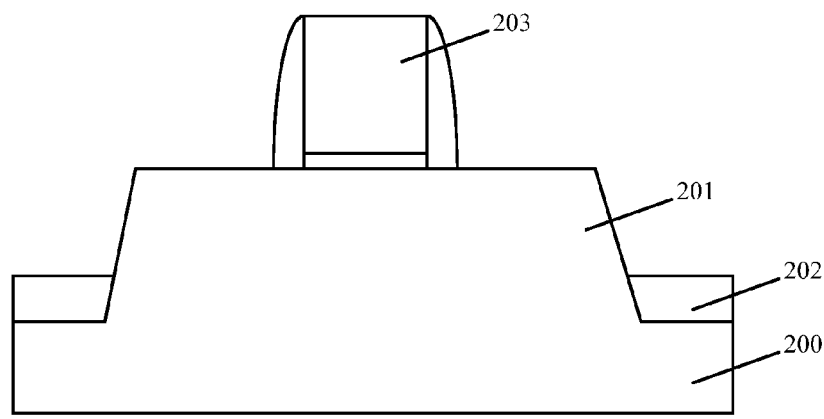

Further, returning to FIG. 19, a gate structure across each fin structure may be formed in both the P-type region and the N-type region (S102). FIG. 3 shows a schematic view of the corresponding semiconductor structure. FIG. 4 shows a cross-section view of the semiconductor structure shown in FIG. 3 along a BB' line.

Referring to FIG. 3 and FIG. 4, a gate structure 203 across each fin structure 201 in the P-type region 210 and the N-type region 220 may be formed. Each gate structure 203 (shown in FIG. 4) may be formed on a portion of the side and the top surfaces of the corresponding fin structure 201.

The gate structure 203 may include a gate dielectric layer formed on a portion of the isolation layer 202 and a portion of the side and the top surfaces of the corresponding fin structure 201. The gate structure 203 may also include a gate electrode layer formed on the surface of a gate dielectric layer and sidewall spacers formed on the side surfaces of the gate electrode layer and the dielectric layer.

In one embodiment, the gate structure 203 may be a dummy gate structure. The dummy gate structure may be used to occupy a space for a subsequently-formed high-k metal gate (HKMG) structure. Therefore, the HKMG structure may be formed by a gate last process. The gate electrode layer may be made of polycrystalline silicon. The gate dielectric layer may be made of $SiO_x$ or a high-k dielectric material (e.g., a material with a dielectric constant greater than 3.9). Moreover, the sidewall spacers (not labeled) may be made of one or more of $SiO_x$, $SiN_x$, SiON, etc. After forming a first covering layer and a second covering layer in subsequent processes, the gate electrode layer may be removed and a metal gate electrode may be formed. When the gate dielectric layer is made of $SiO_x$, after removing the gate electrode layer, the gate dielectric layer may also be removed and a high-k dielectric layer may then be formed prior to the formation of the metal gate electrode.

In another embodiment, the gate structure 203 may be directly adopted in the ultimately-formed transistor. The gate electrode layer may be made of polycrystalline silicon, the gate dielectric layer may be made of $SiO_x$, and the sidewall spacers may be made of one or more of $SiO_x$, $SiN_x$, SiON, etc.

After forming the gate structure 203, the fabrication method may further include forming a lightly-doped region in the corresponding fin structure 201 on both sides of the gate structure 203. The lightly-doped region in the P-type region 210 may be doped with P-type ions and the P-type ions may include boron ions or indium ions. The lightly-doped region in the N-type region 220 may be doped with N-type ions and the N-type ions may include phosphor ions or arsenic ions.

In a subsequent process, a first epitaxial layer may be formed on the top of the fin structure 201 on both sides of the gate structure 203 in the P-type region 210. The first epitaxial layer may be used to form the source region and the drain region of the ultimately-formed PMOS transistor.

Figure 5:
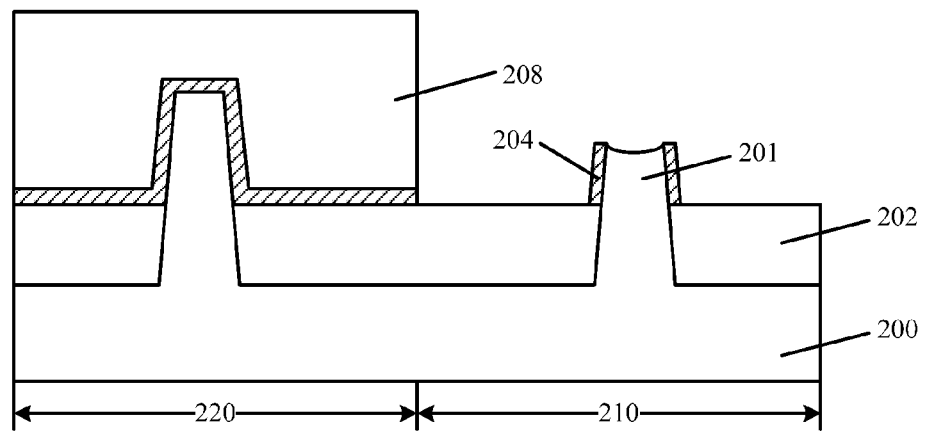

Returning to FIG. 19, a first barrier layer may be formed on the surfaces of the isolation layer, the gate structure, and the fin structure in the N-type region and also on the side surfaces of the fin structure in the P-type region (S103). FIG. 5 shows a schematic cross-section view of the corresponding semiconductor structure.

Referring to FIG. 5, a first barrier layer 204 may be formed. Specifically, in the N-type region 220, the first barrier layer 204 may be formed on the surfaces of the isolation layer 202 and the gate structure 203 (referring to FIG. 4) as well as the side and the top surfaces of the fin structure 201; while in the P-type region 210, the first barrier layer 204 may be formed on the side surfaces of the fin structure 201. Therefore, the first barrier layer 204 may expose a portion of the top surface of the fin structure 201 on both sides of the gate structure 203 in the P-type region (referring to FIG. 4).

The first barrier layer 204 may be used as a mask in a subsequent process to form a first epitaxial layer. The first barrier layer 204 may be made of a material including one or two of $SiO_x$ and SiON.

The first barrier layer 204 may be formed by a method including the following steps. First, a first barrier film may be formed on the surfaces of the isolation layer 202, the fin structures 201, and the gate structures 203. Further, a first patterned layer 208 may be formed to cover the surface of the N-type region 220. An etch back process may then be performed on the first barrier film using the first patterned layer 208 as an etch mask until the surface of the isolation layer 202 and the top surfaces of the fin structure 201 and the gate structure 203 in the P-type region 210 are exposed. After performing the etch back process, the first barrier layer 204 may be formed.

The first barrier film may be formed by chemical vapor deposition (CVD), physical vapor deposition (PVD), or atomic layer deposition (ALD). The etch back process may be an anisotropic dry etching process. Therefore, after the etch back process, the first barrier film may remain on the side surface of the fin structure 201 and the side surface of the gate structure 203. The first patterned layer 208 may include a patterned photoresist layer.

In one embodiment, the first barrier layer 204 is made of $SiN_x$. Further, prior to forming the first barrier film, the fabrication method may also include forming a silicon oxide layer on the surface of the exposed portion of the fin structure 201. The first barrier layer may be formed on the surface of the silicon oxide layer. The silicon oxide layer may be formed by an oxidation process, such as an in-situ steam generation (ISSG) process, etc.

Further, a first opening (not shown) may be formed in the fin structure 201 of the P-type region 220 on each side of the gate structure 203. Specifically, in one embodiment, prior to forming a first epitaxial layer on each side of the gate structure 203 in the P-type region, a first opening may be formed in the fin structure 201 on each side of the gate structure 203 by etching the top of the fin structure 201 in the P-type region using the first barrier layer 204 as an etch mask.

In a subsequent process, a first epitaxial layer may be formed to fill each first opening. The bottom of the first epitaxial layer may be lower than the top surface of the fin structure 201. The first epitaxial layer may induce a stress into the channel region under the gate structure 203. The first opening may be formed by a process including an anisotropic dry etching process.

In one embodiment, the first opening may be formed by a method including the following steps. First, an initial opening may be formed by performing an anisotropic dry etching process to etch the corresponding fin structure 201. Further, an anisotropic wet etching process may be performed to etch the initial opening. After the anisotropic wet etching process, the sidewall of the initial opening and the surface of the fin structure 201 may form a vertex angle and the vertex angle may extend into the fin structure 201 on the bottom of the gate structure 203, forming a first opening. The sidewall of the first opening and the bottom surface of the fin structure 201 may form a Σ shape. Therefore, the first opening may be a Σ-type opening.

Figure 6:
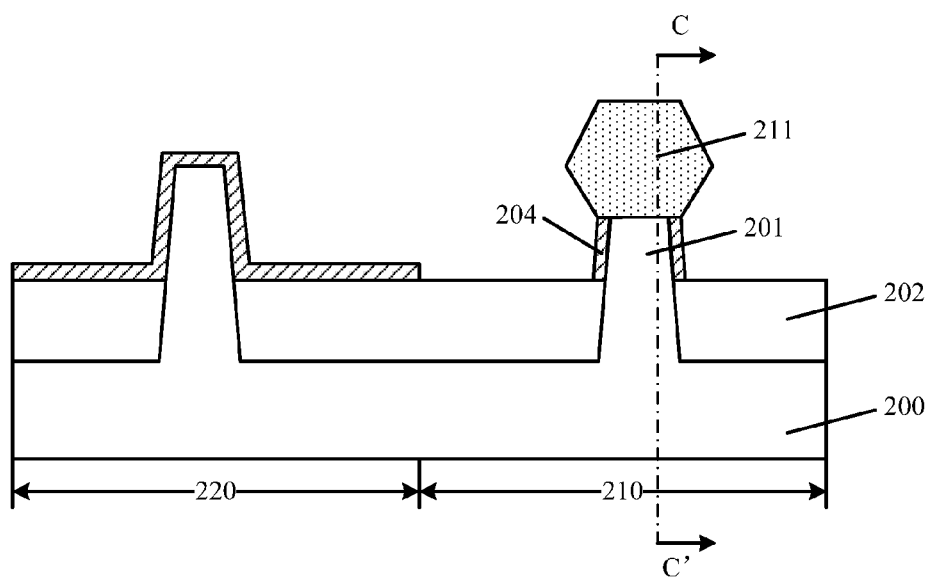
Figure 7:
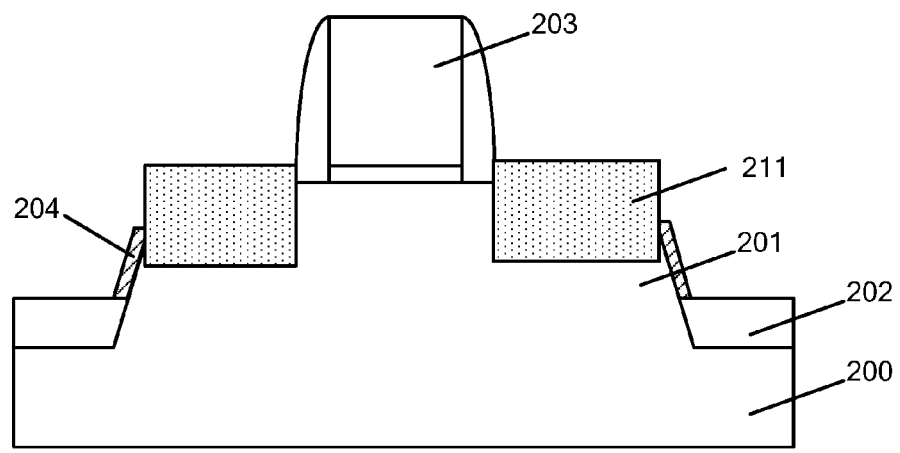

Further, returning to FIG. 19, a first epitaxial layer may be formed on the top surface of the fin structure in the P-type region using the first barrier layer as a mask (S104). FIG. 6 shows a schematic view of the corresponding semiconductor structure. FIG. 7 shows a cross-section view of the semiconductor structure shown in FIG. 6 along a CC' line.

Referring to FIG. 6 and FIG. 7, a first epitaxial layer 211 may be formed on the top surface of the fin structure 201 in the P-type region 210 on both sides of the gate structure 201. The first epitaxial layer may be formed by a selective epitaxial deposition process using the first barrier layer 204 as a mask. Therefore, the first epitaxial layer may fill up both first openings on the two sides of the gate structure 203 in the P-type region 210.

The P-type region may be used to form a PMOS transistor. Therefore, in one embodiment, the first epitaxial layer 211 may be made of SiGe and may be doped with P-type ions. The first epitaxial layer 211 may be formed on the top of the fin structure 201 on both sides of the gate structure 230 so that the first epitaxial layer 211 may form a source region and a drain region for the ultimately-formed PMOS transistor. The first epitaxial layer 211 may induce a compressive stress into the channel region under the gate structure 203 and, thus, the mobility of charge carriers in the ultimately-formed PMOS transistor may be improved.

The first epitaxial layer 211 may be formed by a selective epitaxial deposition process. The deposition parameters for the selective epitaxial deposition process may include a deposition temperature in a range of 500° C. to 800° C., a deposition pressure in a range of 1 Torr to 100 Torr, and a process gas including a silicon-containing gas (such as $SiH_4$, $SiH_2Cl_2$, etc.) and a germanium-containing gas (such as $GeH_4$, etc.). The flowrate of the silicon-containing gas and the germanium-containing gas may be in a range of 1 sccm to 1000 sccm. The process gas may further include HCl and $H_2$. The flowrate of HCl may be in a range of 1 sccm to 1000 sccm and the flowrate of $H_2$ may be in a range of 0.1 sccm to 50 sccm.

In one embodiment, along a direction from the bottom to the top of the first epitaxial layer 211, the atomic percentage concentration of the germanium atoms in the first epitaxial layer 211 may gradually increase from a certain value to a first concentration and then gradually decrease to a second concentration. For example, the first concentration may be 50% while the second concentration may be 5%. The first concentration may be the highest atomic percentage concentration for germanium ions in the first epitaxial layer 211.

A higher atomic percentage concentration of the germanium ions in the first epitaxial layer 211 may correspond to a larger mismatch in lattice constant between the first epitaxial layer 211 and the fin structure 201. Therefore, the first epitaxial layer 211 may induce a compressive stress into the channel region so that the performance of the ultimately-formed PMOS transistor may be desired.

Based on the characteristics of the epitaxial deposition process for forming SiGe, the atomic percentage concentration of germanium atoms may gradually reach the highest value (e.g., the first concentration) in the formed first epitaxial layer 211, and may then gradually decrease until reaching the second concentration of 5%. Therefore, at the surface of the first epitaxial layer 211, the atomic percentage concentration of germanium atoms may be low, while the atomic percentage concentration of silicon atoms may be high.

During the selective epitaxial deposition process, P-type ions may be introduced into the first epitaxial layer 211 using an in-situ doping method. In one embodiment, the P-type ions doped into the first epitaxial layer 211 may be boron ions. The doping concentration of the boron ions in the first epitaxial layer 211 may be smaller than or equal to 1E21 atoms/cm$^3$.

In one embodiment, from the bottom to the top of the first epitaxial layer 211, the doping concentration of boron ions may gradually increase to 1E21 atoms/cm$^3$. Therefore, the highest doping concentration in the first epitaxial layer 211 may be 1E21 atoms/cm$^3$. In a subsequent process, a first covering layer may be formed on the surface of the first epitaxial layer 211, and then a first metal silicide layer may be formed from the first covering layer. Because the doping concentration of boron ions may be high at the surface of the first epitaxial layer 211, after forming the first metal silicide layer, the doping concentration of boron ions at the interface between the first metal silicide layer and the first epitaxial layer 211 may also be high. Such a high boron concentration at the interface between the first metal silicide layer and the first epitaxial layer 211 may help reduce the contact resistance between the first epitaxial layer 211 and the first metal silicide layer.

Figure 8:
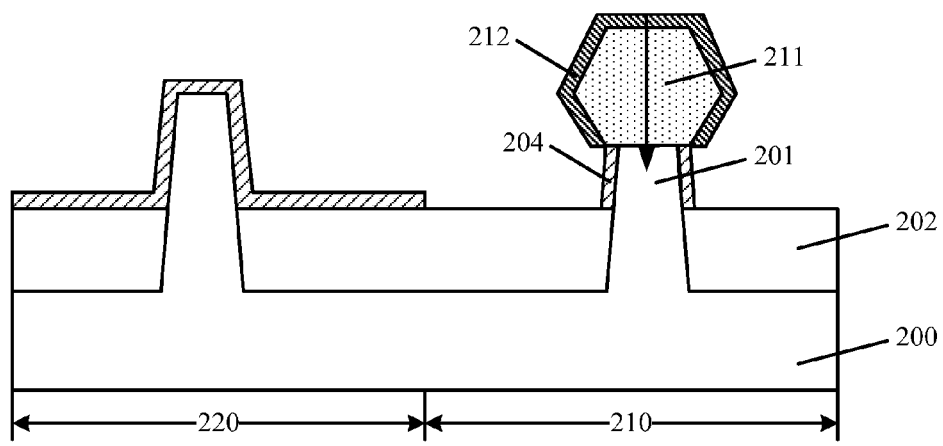

Returning to FIG. 19, further, a first covering layer may be formed on the surface of the first epitaxial layer (S105). FIG. 8 shows a schematic cross-section view of the corresponding semiconductor structure.

Referring to FIG. 8, a first covering layer 212 may be formed on the surface of the first epitaxial layer 211. In one embodiment, the first covering layer 212 may be made of SiGe and may be doped with P-type ions. In other embodiment, the first covering layer 212 may also be made of any other appropriate semiconductor material doped with P-type ions.

In a subsequent silicification process, the first covering layer 212 may be used to form a first metal silicide layer on the first epitaxial layer 211. The first metal silicide layer may be used to reduce the contact resistance between the first epitaxial layer 211 and a subsequently-formed first contact plug.

The first covering layer 212 may be made of SiGe. The first covering layer 212 may be formed by a selective epitaxial deposition process. The atomic percentage concentration of germanium ions in the first covering layer 212 may be in a range of 45% to 55%. In one embodiment, the atomic percentage concentration of germanium ions in the first covering layer 212 may be the first concentration. That is, the atomic percentage concentration of germanium ions in the first covering layer 212 may be 50%. In other embodiments, the atomic percentage concentration of germanium ions in the first covering layer 212 may be greater than the first concentration.

The germanium concentration in the first covering layer 212 may be high so that after forming a silicide layer containing titanium ions on the surface of the first covering layer 212, titanium ions in the silicide layer may react with germanium ions in the first covering layer 212 to form a titanium-silicon compound, such as a titanium-silicon-germanium compound. Based on the properties of the materials, the height of the Schottky barrier between titanium-silicon and the P-type semiconductor may be low. Specifically, the height of the Schottky barrier between titanium-silicon and the P-type semiconductor may be lower than the height of a Schottky barrier between the P-type semiconductor and a nickel-silicon compound or a cobalt-silicon compound. Therefore, the contact resistance between the first covering layer 212 and the first epitaxial layer 211 may be reduced.

Moreover, because the first epitaxial layer 211 may be made of SiGe doped with boron ions, the height of the Schottky barrier between SiGe and titanium-silicon may be lower than the height of the Schottky barrier between Si and titanium-silicon. Therefore, the contact resistance between the first covering layer and the first epitaxial layer 211 may be reduced.

In one embodiment, the P-type ions doped into the first covering layer 212 may be boron ions. Further, during the selective epitaxial deposition process to form the first covering layer 212, the P-type ions may be introduced into the first covering layer 212 using an in-situ doping process. The doping concentration of boron ions in the first covering layer 212 may be higher than the doping concentration of boron ions in the first epitaxial layer 211. In addition, the doping concentration of boron ions in the first covering layer 212 may be in a range of 1E21 atoms/cm$^3$ to 1E22 atoms/cm$^3$. In one embodiment, the doping concentration of boron ions in the first covering layer 212 may be 1E22 atoms/cm$^3$.

The doping concentration of boron ions in the first covering layer 212 may be high so that after forming the first metal silicide layer using the first covering layer 212, the concentration of boron ions in the first metal silicide layer may also be high. Such a high boron concentration in the first metal silicide layer may further reduce the contact resistance between the first metal silicide layer and the first epitaxial layer 211.

Figure 17:
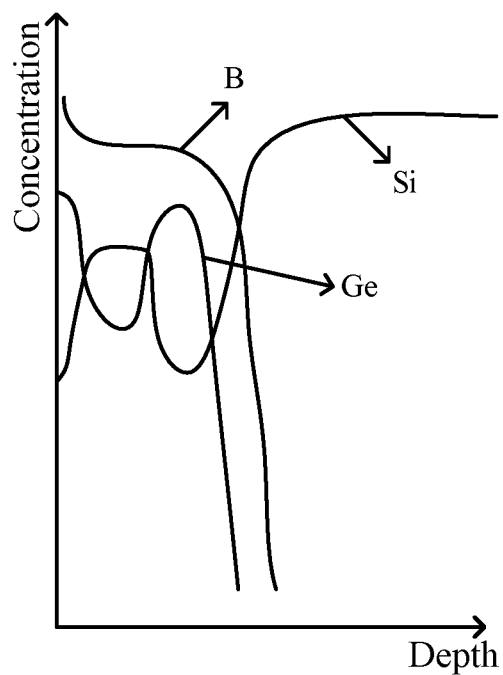
FIG. 17 illustrates variation of atom percentage concentration for Ge, Si, and B in the first epitaxial layer and the first covering layer along a direction from the top of the first covering layer to the bottom of the first epitaxial layer.

FIG. 17 shows variation of atom percentage concentration for Ge, Si, and B in the first epitaxial layer and the first covering layer along a direction from the top of the first covering layer 212 to the bottom of the first epitaxial layer 211.

In a subsequent process, a second epitaxial layer may be formed on the top of the fin structure 201 on both sides of the fin structure 201 in the N-type region 220.

Figure 9:
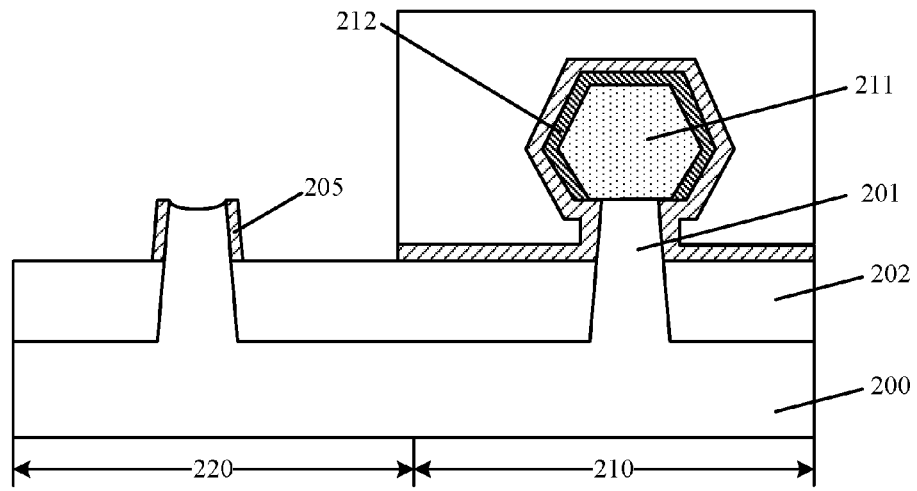

Specifically, returning to FIG. 19, a second barrier layer may be formed on the surfaces of the isolation layer, the gate structure, and the fin structure in the P-type region and also on the side surfaces of the fin structure in the N-type region (S106). FIG. 9 shows a schematic cross-section view of the corresponding semiconductor structure.

Referring to FIG. 9, a second barrier layer 205 may be formed. Specifically, in the P-type region 210, the second barrier layer 205 may be formed on the surfaces of the isolation layer 202 and the gate structure 203 (referring to FIG. 4) as well as the side and the top surfaces of the fin structure 201; while in the N-type region 220, the second barrier layer 205 may be formed on the side surfaces of the fin structure 201. Therefore, the second barrier layer 205 may expose a portion of the top surface of the fin structure 201 on both sides of the gate structure 203 (referring to FIG. 4) in the N-type region 220.

In one embodiment, the fabrication process may also include removing the first barrier layer 204 formed on the isolation layer 202 after forming the first covering layer 212. In other embodiments, after forming the first covering layer 212, the first barrier layer 204 may not be removed.

The second barrier layer 205 may expose a portion of the top surface of the fin structure 201 on both sides of the gate structure 203 in the N-type region. The second barrier layer 205 may be used as a mask in a subsequent process to form a second epitaxial layer. The second barrier layer 205 may be made of one or two of SiN, SiON, etc.

The second barrier layer may be formed by a process including the following steps. First, a second barrier film may be formed on the isolation layer 202, the fin structure 201, the gate structure 203, and the first covering layer 212. Further, a second patterned layer may be formed on the surface of the portion of the second barrier film formed in the P-type region 210. Finally, a second barrier layer 205 may then be formed by performing an etch back process on the second barrier film using the second patterned layer as an etch mask until the surface of the isolation layer 202, the top surface of the fin structure 201, and the top surface of the gate structure in the N-type region 220 are exposed.

The second barrier film may be formed by a process including chemical vapor deposition (CVD), physical vapor deposition (PVD), atomic layer deposition (ALD), etc. The etch back process may be an anisotropic dry etching process. After performing the anisotropic dry etching process, the second barrier layer formed on the sidewall surfaces of the gate structure 203 and the fin structure 201 may be retained. Further, the second patterned layer may include a patterned photoresist layer.

In one embodiment, the second barrier layer 205 may be made of SiN. In addition, prior to the formation of the second barrier layer, the fabrication process may further include forming a $SiO_x$ layer on the exposed portion of the fin structure 201. The second barrier film may then be formed on the surface of the $SiO_x$ layer. The $SiO_x$ layer may be formed by an oxidation process, such as an ISSG process.

In another embodiment, the second barrier layer 205 on the side surfaces of the fin structure 201 in the N-type region 220 may be formed from the portion of the first barrier film formed in the N-type region 220. Specifically, an etch back process may be performed on the portion of the first barrier film in the N-type region 220 until the surfaces of the isolation layer 202, the top surface of the fin structure 201, and the top surface of the gate structure 203 in the N-type region 220 are exposed. As such, the remaining portion of the first barrier film on the side surfaces of the fin structure 201 in the N-type region may become the second barrier layer 205. The second barrier layer 205 in the N-type region 220 may be formed simultaneously with the first barrier layer 204 in the P-type region 210 in one etch back process. The second barrier layer 205 in the N-type region 220 may also be formed by an etch back process different from the etch back process for forming the first barrier layer 204 in the P-type region 210.

In one embodiment, prior to performing a subsequent selective epitaxial deposition process, a second opening may be formed in the fin structure 201 on each side of the gate structure 203 in the N-type region 220 by etching the top of the fin structure 201 in the N-type region 220 using the second barrier layer 205 as an etch mask. In a subsequent process, a second epitaxial layer may be formed in both second openings. The bottom of the second epitaxial layer may be lower than the top surface of the fin structure 201. The second epitaxial layer may induce a stress into the channel region under the gate structure 203. The second opening may be formed by a process including an anisotropic dry etching process.

In one embodiment, the depth of the second openings may be smaller than the depth of the first openings. Therefore, the bottom of the second epitaxial layer formed subsequently in the second openings may be above the bottom of the first epitaxial layer 211 formed in the first openings.

Figure 10:
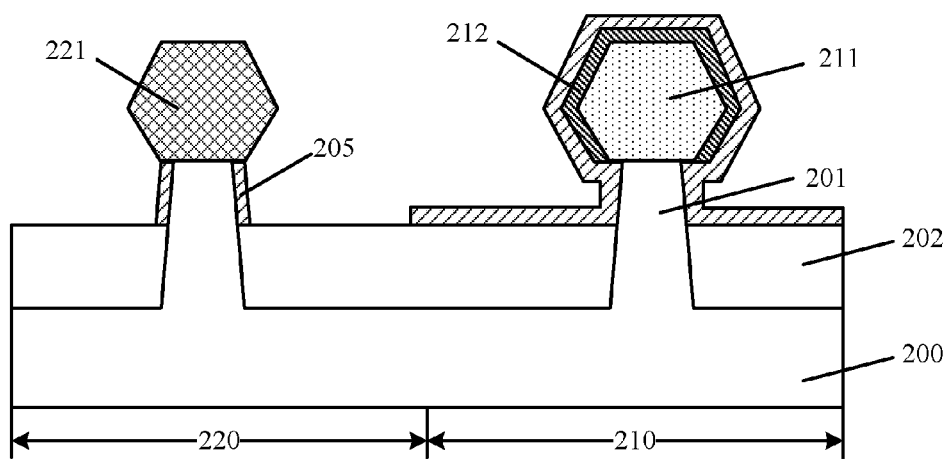

Returning to FIG. 19, further, a second epitaxial layer may be formed on the top surface of the fin structure in the N-type region using the second barrier layer as a mask (S107). FIG. 10 shows a schematic cross-section view of the corresponding semiconductor structure.

Referring to FIG. 10, a second epitaxial layer 221 may be formed on the top surface of the fin structure 201 in the N-type region 220 on both sides of the gate structure 201. The second epitaxial layer may be formed by a selective epitaxial deposition process using the second barrier layer 205 as a mask. Therefore, the second epitaxial layer may fill up both second openings on the two sides of the gate structure 203 in the N-type region 220.

The N-type region 220 may be used to further form an NMOS transistor. Therefore, in one embodiment, the second epitaxial layer 221 may be made of SiP. The second epitaxial layer 221 may be formed on the top of the fin structure 201 on both sides of the gate structure 230 so that the second epitaxial layer 221 may form the source region and the drain region for the ultimately-formed NMOS transistor.

In one embodiment, the concentration of the phosphor ions in the second epitaxial layer 221 may be high. Therefore, SiP in the second epitaxial layer 221 may form a zinc blende structure. The lattice constant of SiP in the zinc blende structure may be smaller than the lattice constant of single crystalline silicon. Therefore, the formed second epitaxial layer 221 may induce a tensile stress into the channel region under the gate structure 203 and, thus, the mobility of charge carriers in the ultimately-formed NMOS transistor may be improved.

In one embodiment, the depth of the second openings may be smaller than the depth of the first openings. Because the growth rate of SiP may be large, the presence of the second openings may help suppress the rapid growth of SiP and, thus, avoid forming a bridge connection between neighboring fin structure and the second epitaxial layer 221. Therefore, forming the second openings may ensure desired morphology for the ultimately-formed second epitaxial layer 221.

The second epitaxial layer 221 may be formed by a selective epitaxial deposition process. The selective epitaxial deposition process for forming the second epitaxial layer 221 may use process parameters including a process temperature in a range of 500° C. to 800° C. and a process pressure in a range of 1 Torr to 100 Torr. The process gas in the selective epitaxial deposition process may include a silicon-containing gas (such as $SiH_4$, $SiH_3C_{12}$, etc.). The flowrate of the silicon-containing gas may be in a range of 1 sccm to 1000 sccm. The process gas of the selective epitaxial deposition process may also include HCl and $H_2$. The flowrate of HCl may be in a range of 1 sccm to 1000 sccm while the flowrate of $H_2$ may be in a range of 100 sccm to 50000 sccm.

During the selective epitaxial deposition process, phosphor ions may be introduced into the second epitaxial layer 221 using an in-situ doping method. The doping concentration of phosphor ions in the second epitaxial layer 221 may be smaller than or equal to 1E21 atoms/cm$^3$.

In one embodiment, along a direction from the bottom to the top of the second epitaxial layer 221, the doping concentration of the phosphor ions may gradually increase from a certain value to 1E21 atoms/cm$^3$. Therefore, at the surface of the second epitaxial layer 221, the doping concentration of phosphor ions may reach the highest value, i.e. 1E21 atoms/cm$^3$. In a subsequent process, a second covering layer may be formed on the surface of the second epitaxial layer 221, and then a second metal silicide layer may be formed from the second covering layer. Because the doping concentration of phosphor ions may be high at the surface of the second epitaxial layer 221, after forming the second metal silicide layer, the doping concentration of phosphor ions at the interface between the second metal silicide layer and the second epitaxial layer 221 may also be high. Such a high phosphor concentration at the interface between the second metal silicide layer and the second epitaxial layer 221 may help reduce the contact resistance between the second epitaxial layer 221 and the second metal silicide layer.

Figure 11:
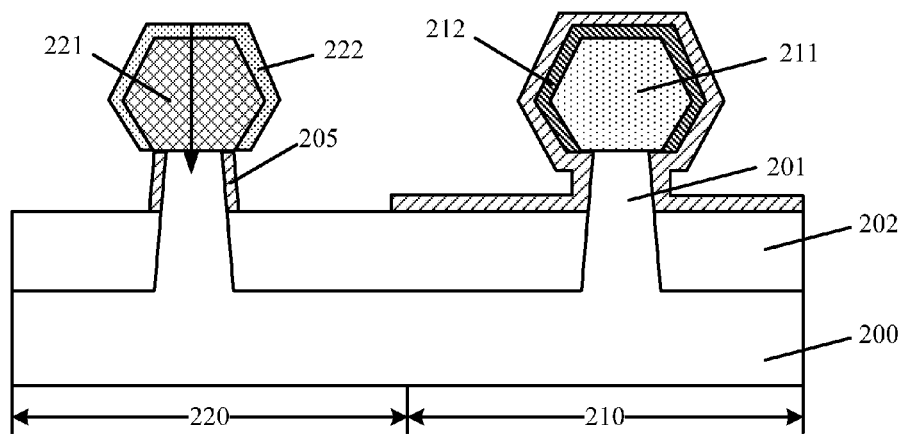

Further, returning to FIG. 19, a second covering layer may be formed on the surface of the second epitaxial layer (S108). FIG. 11 shows a schematic cross-section view of the corresponding semiconductor structure.

Referring to FIG. 11, a second covering layer 222 may be formed on the surface of the second epitaxial layer 221. In one embodiment, the second covering layer 222 may be made of SiGe and may be doped with N-type ions. In other embodiment, the second covering layer 222 may be made of any other appropriate semiconductor material doped with N-type ions.

In a subsequent silicification process, the second covering layer 222 may be used to form a second metal silicide layer on the second epitaxial layer 221. The second metal silicide layer may be used to reduce the contact resistance between the second epitaxial layer 221 and a subsequently-formed second contact plug.

The second covering layer 222 may be made of SiGe. The second covering layer 222 may be formed by a selective epitaxial deposition process. The atomic percentage concentration of germanium ions in the second covering layer 222 may be in a range of 45% to 55%. In one embodiment, the atomic percentage concentration of germanium ions in the second covering layer 222 may be the same as the atomic percentage concentration of germanium ions in the first covering layer 212. That is, the atomic percentage concentration of germanium ions in the second covering layer 222 may also be the first concentration, i.e. 50%. In other embodiments, the atomic percentage concentration of germanium ions in the second covering layer 222 may be greater than the first concentration.

In one embodiment, both the first covering layer 212 and the second covering layer 222 may be made of SiGe and the atomic concentrations of germanium ions in the first covering layer 212 and the second covering layer 222 are the same. Therefore, during a subsequently-performed first annealing process, the silicification rate for the first covering layer 212 may also be the same as the silicification rate for the second covering layer 222. Moreover, because the thickness of the first covering layer 212 may be the same as the thickness of the second covering layer 222, the resistivity of the first covering layer 212 may also be the same as the resistivity of the second covering layer 222. Therefore, the electrical performance of the ultimately-formed PMOS transistor and NMOS transistor may be more stable.

In one embodiment, the N-type ions doped into the second covering layer 222 may be phosphor ions. Further, during the selective epitaxial deposition process to form the second covering layer 222, the N-type ions may be introduced into the second covering layer 222 using an in-situ doping process. The doping concentration of phosphor ions in the second covering layer 222 may be higher than the doping concentration of phosphor ions in the second epitaxial layer 221. In addition, the doping concentration of phosphor ions in the second covering layer 222 may be in a range of 1E21 atoms/cm$^3$ to 1E22 atoms/cm$^3$. In one embodiment, the doping concentration of phosphor ions in the second covering layer 222 may be 1E22 atoms/cm$^3$.

The doping concentration of phosphor ions in the second covering layer 222 may be high so that after forming the second metal silicide layer from the second covering layer 222 in a subsequent process, the concentration of phosphor ions in the second metal silicide layer may also be high. Such a high phosphor concentration in the second metal silicide layer may further reduce the contact resistance between the second metal silicide layer and the second epitaxial layer 221.

Figure 18:
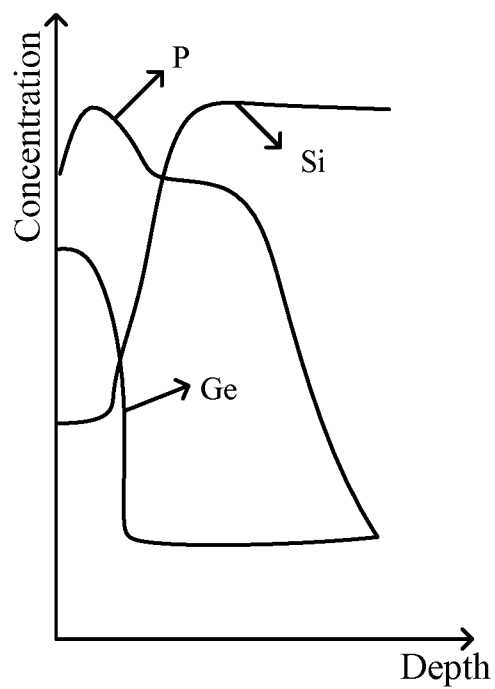
FIG. 18 illustrates variation of atom percentage concentration for Ge, Si, and P in the second epitaxial layer and the second covering layer along a direction from the top of the second covering layer to the bottom of the second epitaxial layer.

FIG. 18 shows variation of atom percentage concentration for Ge, Si, and P in the second epitaxial layer and the second covering layer along a direction from the top of the second covering layer 222 to the bottom of the second epitaxial layer 221.

In a subsequent process, a silicide layer may be formed on at least a portion of the surface of the first covering layer 212 and also on at least a portion of the second covering layer 222. The silicide layer may include titanium ions.

Figure 12:
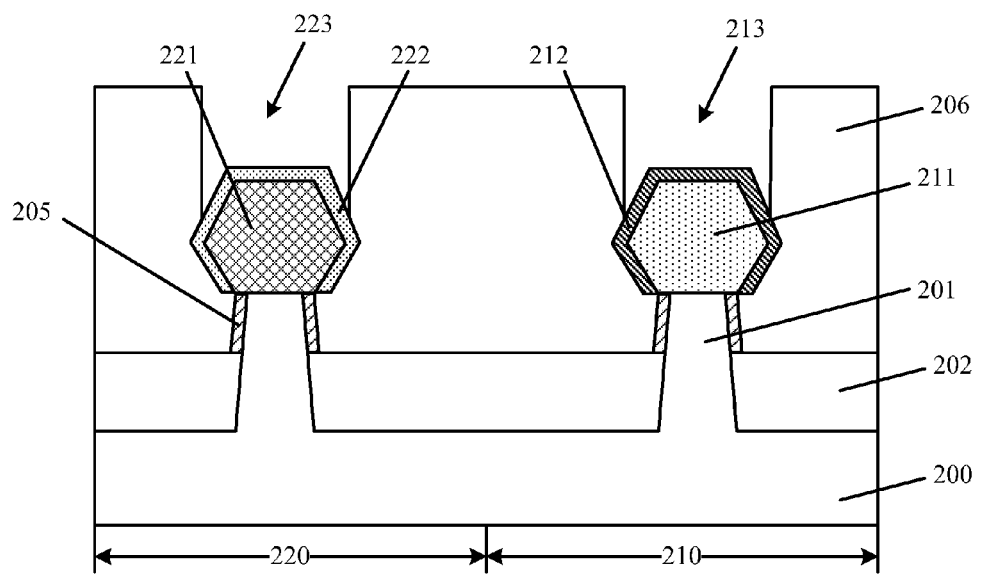

Specifically, returning to FIG. 19, after forming the second covering layer, a dielectric layer may be formed on the surfaces of the isolation layer, the gate structures, and the fin structures with a first via exposing the first covering layer and a second via exposing the second covering layer (S109). FIG. 12 shows a schematic cross-section view of the corresponding semiconductor structure.

Referring to FIG. 12, after the formation of the second covering layer 222, a dielectric layer 206 may be formed on the isolation layer 202, the gate structures 203 (referring to FIG. 4), and the fin structures 201 in both the N-type region and the P-type region. A first via 213 may be formed in the dielectric layer 206 to expose the first covering layer 212 while a second via 223 may be formed in the dielectric layer 206 to expose the second covering layer 222.

In one embodiment, after forming the second covering layer and prior to forming the dielectric layer 206, the portion of the second barrier layer 205 formed on the surface of the isolation layer 202 may be removed.

The dielectric layer 206 may be formed by a method including the following steps. First a dielectric film may be formed on the surfaces of the isolation layer 202, the fin structures 201, the first covering layer 212, the second covering layer 222, and the gate structures 203 (referring to FIG. 4). A planarization process may then be performed on the dielectric film to form the dielectric layer. A third patterned layer may be formed on the surface of the dielectric layer 206. The third patterned layer may expose a portion of the surface of the dielectric layer 206 corresponding to the positions of the subsequently-formed first via 213 and the subsequently-formed second via 223. Further, the first via 213 and the second via 223 may be formed by etching the dielectric layer 206 using the third patterned layer as an etch mask until the first covering layer 212 and the second covering layer 222 are exposed.

The dielectric film may be formed by a process including CVD, PVD, ALD, etc. The CVD process may include flowable chemical vapor deposition (FCVD), plasma enhanced chemical vapor deposition (PECVD), and high aspect ratio chemical vapor deposition process (HARP). The planarization process may be a chemical mechanical polishing process. The process to etch the dielectric layer 206 may be an anisotropic dry etching process. The third patterned layer may include a patterned photoresist layer.

The dielectric layer 206 may be made of $SiO_x$, $SiN_x$, SiON, a low-k dielectric material (e.g., a material with a dielectric constant greater than or equal to 2.5, but less than 3.9, such as porous $SiO_x$ and porous $SiN_x$), or an ultra-low-k dielectric material (e.g., a material with a dielectric constant less than 2.5, such as porous SiCOH).

In another embodiment, the gate structures 203 may be dummy gate structures. The dielectric layer 206 may further include a first sub-dielectric layer and a second sub-dielectric layer. The first sub-dielectric layer may be formed on the surfaces of the isolation layer 202, the fin structures 201, the first covering layer 212, and the second covering layer 222. The second sub-dielectric layer may be formed on the surfaces of the first sub-dielectric layer and the gate structures 203. The surface of the first sub-dielectric layer may be leveled with the top surface of the gate structures 203.

The first sub-dielectric layer may be formed by a process including the following steps. First, a first sub-dielectric film may be formed on the surfaces of the substrate and the gate structures 203. A first sub-dielectric layer may then be formed by performing a planarization process on the first sub-dielectric film until the top surface of the gate structures 203 is exposed. The first sub-dielectric layer may be used as a mask during a subsequent process to remove the dummy gate electrode in each gate structure 203 and then form a HKMG. After removing the dummy gate electrode in each gate structure and forming the corresponding HKMG, the second sub-dielectric layer may then be formed by a process including CVD, PVD, ALD, etc.

Specifically, after forming the first sub-dielectric layer and prior to forming the second sub-dielectric layer, the dummy gate electrode in each gate structure 203 may be removed to form a gate electrode opening. Further, a high-k dielectric layer may be formed on the inner surface of the sidewalls of the gate electrode opening. Finally, a metal gate electrode may be formed on the high-k dielectric layer by filling up the gate electrode opening. As such a HKMG is formed.

In other embodiments, the gate structure 203 may be a dummy gate structure with a high-k dielectric layer formed between the corresponding fin structure 201 and the dummy gate electrode. Accordingly, after forming the first sub-dielectric layer and removing the dummy gate electrode, a metal gate electrode may be directly formed on the high-k dielectric layer to complete a HKMG.

Figure 13:
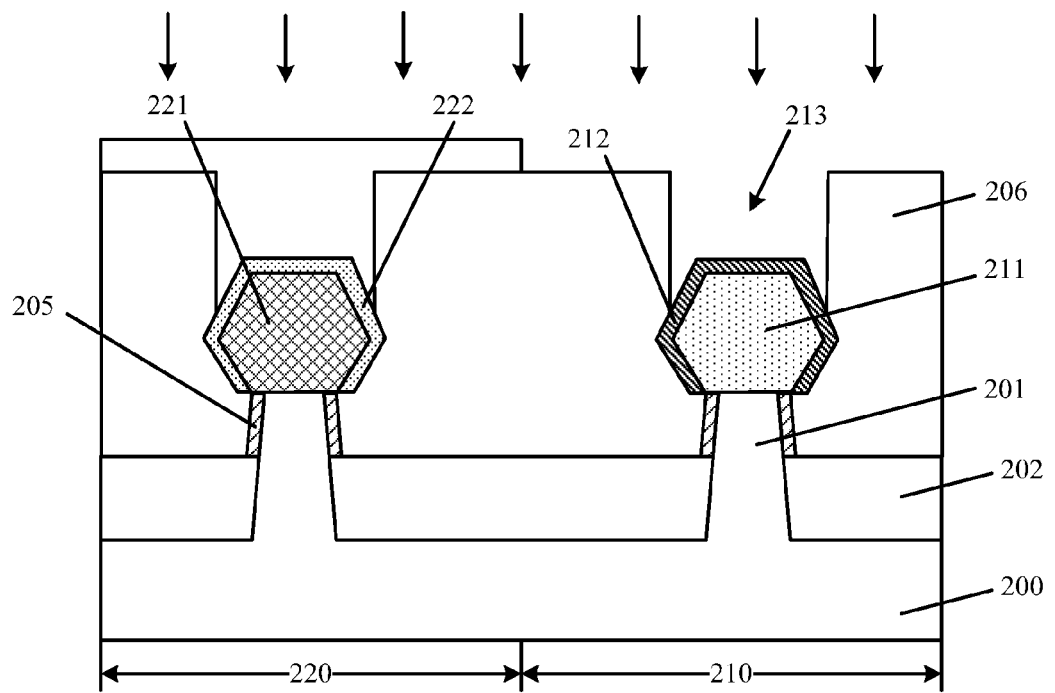

Further, returning to FIG. 19, an ion implantation process may be performed on the first covering layer through the first via to introduce P-type doping ions into the first covering layer (S110). FIG. 13 shows a schematic diagram of performing the ion implantation process on the first covering layer.

Referring to FIG. 13, a mask layer (not labeled) may be formed to cover the N-type region 220. An ion implantation process may then be performed to introduce ions into the first covering layer 212 exposed on the bottom of the first via 213. Specifically, P-type ions may be implanted into the surface of the first covering layer 212 to reduce the contact resistance between the first covering layer 212 and a subsequently-formed first contact plug. The mask layer may then be removed after the ion implantation process. In one embodiment, the P-type ions implanted into the first covering layer 212 on the bottom of the first via 213 may be boron ions. The P-type ions may be implanted into the first covering layer 212 along a direction perpendicular to the surface of the substrate 200.

Figure 14:
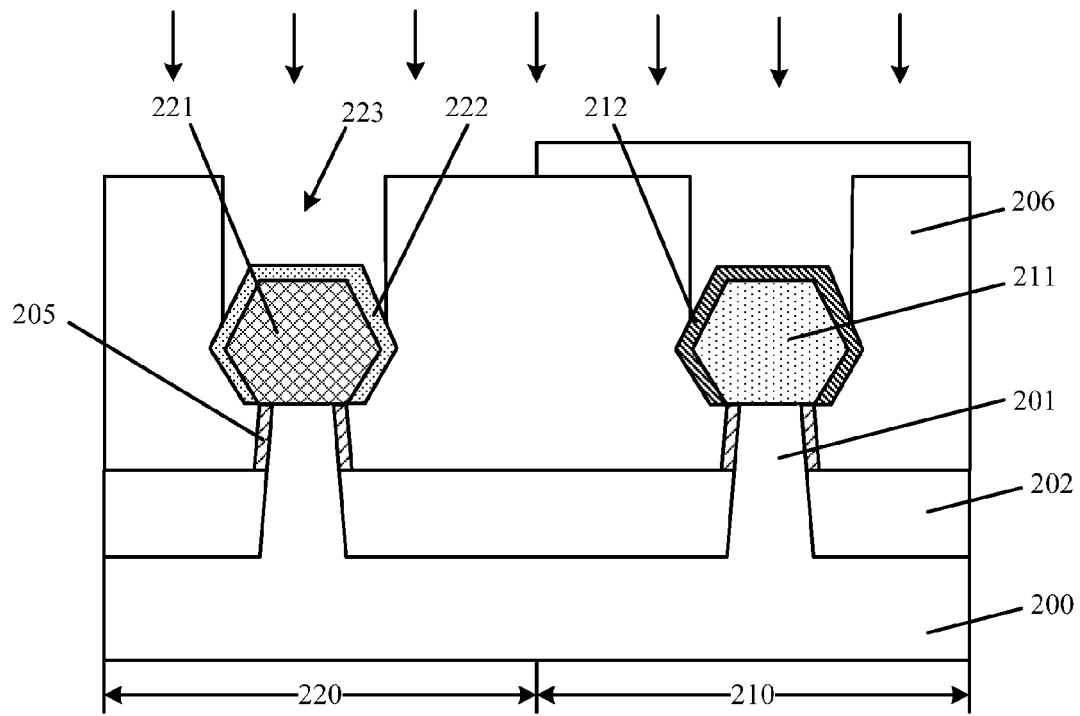

Further, returning to FIG. 19, an ion implantation process may be performed on the second covering layer through the second via to introduce N-type doping ions into the second covering layer (S111). FIG. 14 shows a schematic diagram of performing the ion implantation process on the second covering layer.

Referring to FIG. 14, a mask layer (not labeled) may be formed to cover the P-type region 210. An ion implantation process may then be performed to introduce ions into the second covering layer 222 exposed on the bottom of the second via 223. Specifically, N-type ions may be implanted into the surface of the second covering layer 222 to reduce the contact resistance between the second covering layer 222 and a subsequently-formed second contact plug. The mask layer may then be removed after the ion implantation process. In one embodiment, the N-type ions implanted into the second covering layer 222 on the bottom of the second via 223 may be phosphor ions. The N-type ions may be implanted into the second covering layer 222 along a direction perpendicular to the surface of the substrate 200.

In one embodiment, after implanting ions into the first covering layer 212 and the second covering layer 222, a second annealing process may be performed to active the P-type ions in the first covering layer 212 and the first epitaxial layer 211 as well as the N-type ions in the second covering layer 222 and the second epitaxial layer 221. The second annealing process may be a spike annealing process or a laser annealing process.

Figure 15:
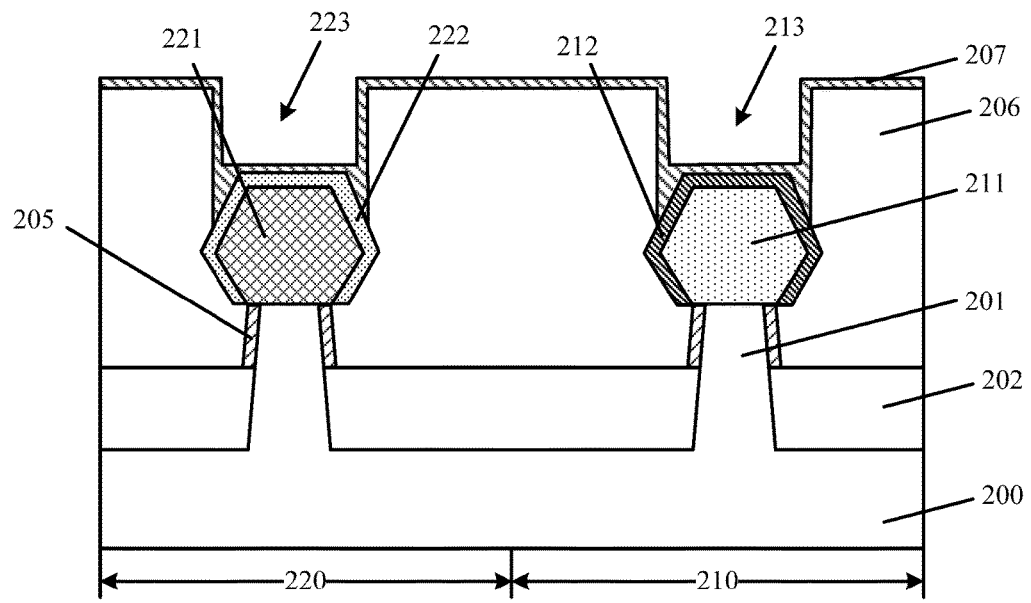

Further, returning to FIG. 19, a silicification layer may be formed on the surface of the first covering layer on the bottom of the first via and also on the surface of the second covering layer on the bottom of the second via (S112). FIG. 15 shows a schematic cross-section view of the corresponding semiconductor structure.

Referring to FIG. 15, a silicification layer 207 may be formed on the surface of the first covering layer 212 on the bottom of the first via 213 and also on the surface of the second covering layer 222 on the bottom of the second via 223.

In one embodiment, the silicification layer 207 may be a metal layer containing titanium ions. The silicification layer 207 may be formed by a process including CVD, PVD, ALD, etc. In one embodiment, the silicification layer 207 may be formed by an ALD process. The thickness of the silicification layer 207, made of titanium silicide, may be in a range of 10 nm to 50 nm.

In one embodiment, the silicification layer 207 may also be formed on the surface of the dielectric layer 206, the sidewall surface of the first via 213, and the sidewall surface of the second via 223.

In a subsequent process, a portion of the first covering layer 212 in contact with the silicification layer 207 may react with the silicification layer 207 and, thus, form a first metal silicide layer. Similarly, a portion of the second covering layer 222 in contact with the silicification layer 207 may react with silicification layer 207 and, thus, form a second metal silicide layer.

Figure 16:
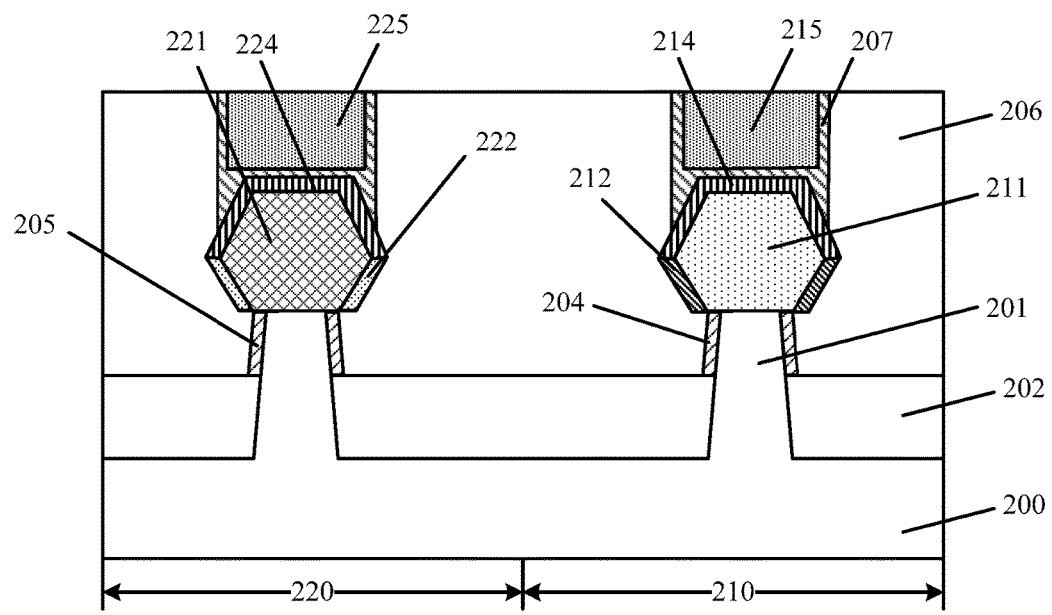

Specifically, returning to FIG. 19, a first annealing process may be performed to let titanium ions diffuse into the first covering layer and the second covering layer and thus form a first metal silicide layer from the first covering layer and a second metal silicide layer from the second covering layer (S113). FIG. 16 shows a schematic cross-section view of the corresponding semiconductor structure.

Referring to FIG. 16, after forming the silicification layer 207, a first annealing process may be performed. During the first annealing process, the titanium ions in the silicification layer 207 may diffuse into the first covering layer 212 and the second covering layer 222, resulting in forming a first metal silicide layer 214 in the first covering layer 212 and a second silicide layer 224 in the second covering layer 222.

The first annealing process may be a flash annealing process. The process parameters used in the first annealing process may include a process temperature in a range of 750° C. to 950° C., a process time in a range of 10 ms to 500 ms, and a process gas including $N_2$ or an inert gas such as Ar or He. In one embodiment, the first annealing process is performed at 800° C.

The silicification layer 207 may be in contact with the first covering layer 212 and the second covering layer 222, and may contain titanium ions. Therefore, during the first annealing process, the titanium ions may diffuse into the first covering layer 212 and the second covering layer 222 to form the first metal silicide layer 214 and the second metal silicide layer 224. Specifically, the first metal silicide layer 214 and the second metal silicide layer 224 may be made of TiSiGe. Further, because the first covering layer 212 may contain a high level of doped boron ions, the first metal silicide layer 214 formed in the first covering layer 212 may also contain a high level of doped boron ions. Similarly, because the second covering layer 222 may contain a high level of doped phosphor ions, the second metal silicide layer 224 formed in the second covering layer 222 may also contain a high level of doped phosphor ions.

In the P-type region 210, because the first epitaxial layer 211 may be made of SiGe and the first metal silicide layer 214 may be made of TiSiGe, the height of the Schottky barrier between the first epitaxial layer 211 and the first metal silicide layer 214 may be small. Therefore, the contact resistance between the first epitaxial layer 211 and the first metal silicide layer 214 may also be small.

In addition, the first metal silicide layer 214 may contain a high level of doped boron ions and the high doping concentration of boron ions may further reduce the height of Schottky barrier between the first epitaxial layer 211 and the first metal silicide layer 214. Therefore, the contact resistance between the first epitaxial layer 211 and the first metal silicide layer 214 may be further reduced.

In the N-type region 220, the second epitaxial layer 221 may be made of SiP, while the second metal silicide layer 224 may be made of a phosphor-doped TiSiGe compound, i.e. a material containing titanium-silicon-phosphor. The concentration of phosphor ions at the surface of the second epitaxial layer 221 may be high, which may help reduce the contact resistance between the second epitaxial layer 221 and the second metal silicide layer 224.

In addition, the second metal silicide layer 224 may contain a high level of doped phosphor ions and the high doping concentration of phosphor ions may further reduce the height of Schottky barrier between the second epitaxial layer 221 and the second metal silicide layer 224. Therefore, the contact resistance between the second epitaxial layer 221 and the second metal silicide layer 224 may be further reduced.

In one embodiment, before or after performing the first annealing process, the first via 213 (referring to FIG. 15) and the second via 223 (referring to FIG. 15) may be filled with a conductive material to form a first contact plug 215 in the first via 213 and a second contact plug 225 in the second via 223.

The conductive material may include Cu, W, and Al. The first contact plug 215 and the second contact plug 225 may be formed by a process including the following steps. First, a conductive film may be formed on the surface of the dielectric layer 208 and also in the first via 213 and the second via 223. A planarization process may then be performed on the conductive film until the surface of the dielectric layer 206 is exposed. As such, the first contact plug 215 may be formed in the first via 213 and the second contact plug 225 may be formed in the second via 223.

The conductive material may be formed by a process including CVD, PVD, electroplating, and chemical plating. The planarization process may be a chemical mechanical polishing process. In one embodiment, prior to forming the first contact plug 215 and the second contact plug 225, the silicification layer 207 may not be removed. The silicification layer 207 may serve as a barrier layer between the first contact plug 215 and the dielectric layer 206 and also between the second contact plug 225 and the dielectric layer 206. In other embodiments, the silicification layer 207 may be removed prior to forming the first contact plug 215 and the second contact plug 225.

The present disclosure further provides a Fin-FET device. FIG. 16 shows an exemplary semiconductor structure consistent with the disclosed embodiments.

Referring to FIG. 16, the Fin-FET device may include a substrate 200 with a plurality of P-type regions 210 and a plurality of N-type regions 220. Further, each of the P-type region 210 and the N-type region 220 may include a plurality of fin structures 210 formed on the substrate 200. For illustration purposes, the semiconductor structure shown in FIG. 16 is described to have one P-type region 210 and one N-type region 220 with each including one fin structure 210. The width of each fin structure 210 may be smaller than or equal to 20 nm. In other embodiments, the number of P-type regions 210 and the number of N-type regions may be greater than one, while the number of fin structures formed on each P-type region 210 or on each N-type region 220 may also be greater than one.

In one embodiment, the Fin-FET device may include an isolation layer 202 formed on the surface of the substrate between neighboring fin structures 201. The isolation layer 202 may cover a bottom portion of the side surfaces of each fin structure 201. The top surface of the isolation layer 202 may be lower than the top surface of the fin structures 201. The thickness of the isolation layer 202 may be in a range of 50 nm to 80 nm.

Further, the Fin-FET device may also include a gate structure (not shown) formed on the top surface of each fin structure 201. The gate structure may be a HKMG. In addition, the sidewall surface of each fin structure 201 may be covered by a barrier layer. Specifically, a first barrier layer 204 may cover the sidewall surfaces of the fin structure 201 in the P-type region while a second barrier layer 205 may cover the sidewall surfaces of the fin structure 201 in the N-type region. The first barrier layer 204 and the second barrier layer 205 may or may not be formed from a same barrier film.

The Fin-FET device may further include a first epitaxial layer 211 formed on the top surface of the fin structure 201 in the P-type region and on both sides of the gate structure (not shown). The bottom of the first epitaxial layer 211 may be lower than the top surface of the fin structure 201. The cross section of the first epitaxial layer 211 may have an/shape. The first epitaxial layer 211 may be made of SiGe and doped with P-type ions. Specifically, along a direction from the bottom to the top of the first epitaxial layer 211, the atomic percentage concentration of the germanium atoms in the first epitaxial layer 211 may gradually increase from a certain value to a first concentration and then gradually decrease to a second concentration. For example, the first concentration may be 50% while the second concentration may be 5%. The first concentration may be the highest atomic percentage concentration for germanium ions in the first epitaxial layer 211. Moreover, the doped P-type ions in the first epitaxial layer 211 may be boron ions. The doping concentration of the P-type ions in the first epitaxial layer 211 may be lower than or equal to 1E21 atoms/cm$^3$.

The Fin-FET device may also include a second epitaxial layer 221 formed on the top surface of the fin structure 201 in the N-type region and on both sides of the gate structure (not shown). The bottom of the second epitaxial layer 221 may be lower than the top surface of the fin structure 201. The cross section of the second epitaxial layer 221 may have an/shape. The second epitaxial layer 221 may be made of SiP. Specifically, along a direction from the bottom to the top of the second epitaxial layer 221, the atomic percentage concentration of the phosphor atoms in the second epitaxial layer 221 may gradually increase from a certain value to a highest concentration of 1E21 atoms/cm$^3$. That is, the doping concentration of phosphor ions in the second epitaxial layer 221 may be smaller than or equal to 1E21 atoms/cm$^3$.

The Fin-FET device may further include a first covering layer 212 formed on the surface of the first epitaxial layer 211 in the P-type region, a second covering layer 222 formed on the surface of the second epitaxial layer 221 in the N-type region, and a silicification layer 207 formed over the first covering layer 212 and the second covering layer 222. The silicification layer 207 may contain titanium ions.

Further, the Fin-FET device may include a first metal silicide layer 214 formed from a top portion of the first covering layer 212 in the P-type region and a second metal silicide layer 224 formed from a top portion of the second covering layer 222 in the N-type region. The first metal silicide layer 214 and the second metal silicide layer 224 may be simultaneously formed by performing a first annealing process to let the titanium ions in the silicification layer 207 diffuse into the top portion of the first covering layer 212 and the top portion of the second covering layer 222, respectively. Further, because the first covering layer 212 may contain a high level of doped boron ions, the first metal silicide layer 214 formed in the first covering layer 212 may also contain a high level of doped boron ions. Similarly, because the second covering layer 222 may contain a high level of doped phosphor ions, the second metal silicide layer 224 formed in the second covering layer 222 may also contain a high level of doped phosphor ions.

The Fin-FET device may also include a first contact plug 215 formed over the first metal silicide layer 214, a second contact plug 225 formed over the second metal silicide layer 224, and a dielectric layer 206 formed on the surfaces of the isolation layer 202. The top surfaces of the dielectric layer 206, the first contact plug 215, and the second contact plug may be leveled with each other.

In the P-type region 210, because the first epitaxial layer 211 may be made of SiGe and the first metal silicide layer 214 may be made of TiSiGe, the height of the Schottky barrier between the first epitaxial layer 211 and the first metal silicide layer 214 may be small. Therefore, the contact resistance between the first epitaxial layer 211 and the first metal silicide layer 214 may also be small.

In addition, the first metal silicide layer 214 may contain a high level of doped boron ions and the high doping concentration of boron ions may further reduce the height of Schottky barrier between the first epitaxial layer 211 and the first metal silicide layer 214. Therefore, the contact resistance between the first epitaxial layer 211 and the first metal silicide layer 214 may be further reduced.

In the N-type region 220, the second epitaxial layer 221 may be made of SiP, while the second metal silicide layer 224 may be made of a phosphor-doped TiSiGe compound, i.e. a material containing titanium-silicon-phosphor. The concentration of phosphor ions at the surface of the second epitaxial layer 221 may be high, which may help reduce the contact resistance between the second epitaxial layer 221 and the second metal silicide layer 224.

In addition, the second metal silicide layer 224 may contain a high level of doped phosphor ions and the high doping concentration of phosphor ions may further reduce the height of Schottky barrier between the second epitaxial layer 221 and the second metal silicide layer 224. Therefore, the contact resistance between the second epitaxial layer 221 and the second metal silicide layer 224 may be further reduced.

Compared to existing Fin-FETs and fabrication methods, the disclosed Fin-FET device and fabrication method may demonstrate several advantages in reducing the contact resistance in the formed Fin-FET devices.

According to the disclosed Fin-FET device, the P-type region is used to form a PMOS transistor while the N-type region is used to form an NMOS transistor. In the P-type region, the first covering layer formed on the surface of the first epitaxial layer contains germanium ions, while the silicification layer subsequently-formed on the surface of the first covering layer contains titanium ions. Therefore, after performing the first annealing process, the first metal silicide layer formed from the top portion of the first covering layer is made of TiSiGe. In addition, in the ultimately-formed PMOS transistor, the first epitaxial layer is made of SiGe. Therefore, based on the properties of the materials, the height of the Schottky barrier between TiSiGe and SiGe may be low. Specifically, the height of the Schottky barrier between SiGe and TiSiGe may be lower than the height of a Schottky barrier between SiGe and nickel-silicon or cobalt-silicon. Therefore, the contact resistance between the first metal silicide layer and the first epitaxial layer may be reduced.

In the N-type region, the silicification layer formed on the surface of the second covering layer contains titanium ions while the second covering layer is doped with N-type ions. For example, the second covering layer is doped with phosphor ions. Therefore, after performing the first annealing process, the second metal silicide layer formed from the top portion of the second covering layer is made of TiSiGe. In addition, the second metal silicide layer is also doped with N-type ions such as phosphor ions. Based on the properties of the material, the Fermi level of the TiSiGe may be changed with changing the doping concentration of phosphor ions. Therefore, for the ultimately-formed NMOS transistor, doping N-type ions into the second metal silicide layer may help reduce the contact resistance between the second epitaxial layer and the second metal silicide layer.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a Fin-FET device, comprising:
    providing a substrate having a plurality of P-type regions and a plurality of N-type regions;

forming a plurality of fin structures on each of the P-type regions and the N-type regions of the substrate, wherein a gate structure is formed on a top surface of each fin structure;
forming a first epitaxial layer on a top surface of each fin structure on both sides of a corresponding gate structure in the P-type regions, wherein the first epitaxial layer is doped with P-type ions;
forming a first covering layer covering each first epitaxial layer, the first covering layer containing germanium ions and doped with P-type ions;
forming a second epitaxial layer on a top surface of each fin structure on both sides of a corresponding gate structure in the N-type regions;
forming a second covering layer covering each second epitaxial layer, the second covering layer containing germanium ions and doped with N-type ions;
forming a silicification layer on at least a portion of the first covering layer and on at least a portion of the second covering layer, wherein the silicification layer contains titanium ions; and
performing a first annealing process to let the titanium ions in the silicification layer diffuse into the first covering layer to form a first metal silicide layer and also diffuse into the second covering layer to form a second metal silicide layer,
wherein prior to forming the first epitaxial layer, an isolation layer is formed on a top surface of the substrate to cover a portion of side surfaces of each fin structure, wherein a top surface of the isolation layer is lower than the top surface of the fin structures; and
wherein forming the first epitaxial layer further includes:
forming a first barrier layer on the surfaces of the isolation layer, the gate structure, and the fin structure in the N-type region and also on the side surfaces of the fin structure in the P-type region;
etching a top portion of the fin structure in the P-type region using the first barrier layer as an etch mask;
forming the first epitaxial layer on the top surface of the fin structure in the P-type region though a selective epitaxial deposition process using the first barrier layer as a mask; and
removing the first barrier layer formed on the isolation layer after forming the first covering layer.

2. The method for fabricating the Fin-FET device according to claim 1, wherein:
the first epitaxial layer is made of SiGe;
the first epitaxial layer is doped with P-type ions; and
along a direction from a bottom to a top of the first epitaxial layer, an atomic percentage concentration of germanium ions in the first epitaxial layer gradually increases to a first concentration and then decreases to a second concentration.

3. The method for fabricating the Fin-FET device according to claim 2, wherein:
the first concentration is 50%; and
the second concentration is 5%.

4. The method for fabricating the Fin-FET device according to claim 2, wherein:
the P-type ions doped into the first epitaxial layer are boron ions; and
a doping concentration of boron ions in the first epitaxial layer is smaller than or equal to 1E21 atoms/cm$^3$.

5. The method for fabricating the Fin-FET device according to claim 4, wherein:
the first covering layer is made of SiGe;
an atomic percentage concentration of germanium ions in the first covering layer is in a range of 45% to 55%; and
the P-type ions doped in the first covering layer are boron ions.

6. The method for fabricating the Fin-FET device according to claim 5, wherein a doping concentration of boron ions in the first covering layer is greater than the doping concentration of boron ions in the first epitaxial layer.

7. The method for fabricating the Fin-FET device according to claim 6, wherein the doping concentration of boron ions in the first covering layer is in a range of 1E21 atoms/cm$^3$ to 1E22 atoms/cm$^3$.

8. The method for fabricating the Fin-FET device according to claim 1, wherein:
the second epitaxial layer is made of SiP; and
a doping concentration of phosphor ions in the second epitaxial layer is smaller than or equal to 1E21 atoms/cm$^3$.

9. The method for the Fin-FET device according to claim 1, wherein:
the second covering layer is made of SiGe;
an atomic percentage concentration of the second covering layer is in a range of 45% to 55%; and
the N-type ions doped in the second covering layer are phosphor ions.

10. The method for fabricating the Fin-FET device according to claim 9, wherein the doping concentration of phosphor ions in the second covering layer is in a range of 1E21 atoms/cm$^3$ to 1E22 atoms/cm$^3$.

11. The method for fabricating the Fin-FET device according to claim 1, wherein forming the second epitaxial layer further includes:
forming a second barrier layer on the surfaces of the isolation layer, the gate structure, and the fin structure in the P-type region and also on the side surfaces of the fin structure in the N-type region;
etching a top portion of the fin structure in the N-type region using the second barrier layer as an etch mask;
forming the second epitaxial layer on the top surface of the fin structure in the N-type region though a selective epitaxial deposition process using the second barrier layer as a mask; and
removing the second barrier layer formed on the isolation layer after forming the second covering layer.

12. The method for fabricating the Fin-FET device according to claim 1, wherein forming the silicification layer on at least a portion of the first covering layer and also on at least a portion of the second covering layer further includes:
forming a dielectric layer on surfaces of the isolation layer, the gate structures, and the fin structures after forming the second covering layer, wherein a first via formed in the dielectric layer exposes the first covering layer and a second via formed in the dielectric layer exposes the second covering layer; and
forming the silicification layer on a surface of the first covering layer exposed in a bottom of the first via and on a surface of the second covering layer exposed in a bottom of the second via.

13. The method for fabricating the Fin-FET device according to claim 12, prior to forming the silicification layer, further including:
implanting P-type ions into the first covering layer exposed in the first via; and
implanting N-type ions into the second covering layer exposed in the second via.

14. The method for fabricating the Fin-FET device according to claim 12, after or prior to performing the first annealing process, further including forming a first contact plug in the first via and a second contact plug in the second via by filling up the first via and the second via with a conductive material.

* * * * *